United States Patent
Mondal et al.

(10) Patent No.: US 11,821,927 B2
(45) Date of Patent: Nov. 21, 2023

(54) HIGH-VOLTAGE TOLERANT, HIGH-SPEED REVERSE CURRENT DETECTION AND PROTECTION FOR BUCK-BOOST CONVERTERS

(71) Applicant: Cypress Semiconductor Corporation, San Jose, CA (US)

(72) Inventors: Partha Mondal, Paschim Medinipur (IN); Tudu Balia, Bangalore (IN); Hariom Rai, Bangalore (IN); Pulkit Shah, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 190 days.

(21) Appl. No.: 17/396,317

(22) Filed: Aug. 6, 2021

(65) Prior Publication Data

US 2022/0069712 A1 Mar. 3, 2022

Related U.S. Application Data

(60) Provisional application No. 63/074,075, filed on Sep. 3, 2020, provisional application No. 63/073,580, filed on Sep. 2, 2020.

(51) Int. Cl.
*H02M 1/00* (2006.01)
*G01R 19/175* (2006.01)

(52) U.S. Cl.
CPC ........ *G01R 19/175* (2013.01); *H02M 1/0009* (2021.05)

(58) Field of Classification Search
CPC ............. H02M 1/0058; H02M 3/1582; H02M 1/0003; H02M 1/0009; G01R 19/175
See application file for complete search history.

(56) References Cited

U.S. PATENT DOCUMENTS

| | | | | |
|---|---|---|---|---|
| 10,693,376 B2* | 6/2020 | Pizzotti | ............... | H02M 3/1582 |
| 10,992,231 B1* | 4/2021 | Yang | ..................... | H02M 3/157 |
| 2019/0305666 A1* | 10/2019 | Yang | ..................... | H02M 1/088 |
| 2022/0077784 A1* | 3/2022 | Zhang | ................. | H02M 3/1582 |

* cited by examiner

*Primary Examiner* — Patrick C Chen

(57) ABSTRACT

A controller includes a buck gate driver coupled to first high-side switch and first low-side switch of a buck-boost (BB) converter. A zero crossing detection (ZCD) comparator is coupled to first low-side switch. The ZCD comparator is to, while the BB converter operates in buck mode: detect zero current flow through inductor; and turn off first low-side switch in response to detecting the zero current. A boost gate driver is coupled to second high-side switch and second low-side switch of the BB converter. A reverse current detection (RCD) comparator coupled to second high-side switch. The RCD comparator is to, while the BB converter operates in boost mode: detect zero current flow through second high-side switch; and turn off second high-side switch in response to detecting the zero current.

17 Claims, 10 Drawing Sheets

HIGH-VOLTAGE TOLERANT, HIGH-SPEED REVERSE CURRENT DETECTION AND PROTECTION FOR BUCK-BOOST CONVERTERS

RELATED APPLICATIONS

This application claims the benefit of U.S. Provisional Patent Application No. 63/073,580, filed on Sep. 2, 2020, and U.S. Provisional Patent Application No. 63/074,075, filed on Sep. 3, 2020, the entire contents of which is incorporated herein by this reference.

TECHNICAL FIELD

This disclosure relates to integrated circuits (ICs) that control Universal Serial Bus (USB) power delivery to electronic devices.

BACKGROUND

Various electronic devices (e.g., such as smartphones, tablets, notebook computers, laptop computers, chargers, adapters, power banks, etc.) are configured to transfer power through USB connectors according to USB power delivery protocols defined in various versions and revisions of the USB Power Delivery (USB-PD) specification. For example, in some applications an electronic device may be configured as a power consumer to receive power through a USB connector (e.g., for battery charging), while in other applications an electronic device may be configured as a power provider to provide power to another device that is connected thereto through a USB connector. In various applications, electronic manufacturers may also use power converters (e.g., such as buck-boost converters) that need to meet various USB-PD specification requirements such as, for example, requirements for output voltage (Vout) monotonicity and stability.

DETAILED DESCRIPTION

Figure 1:
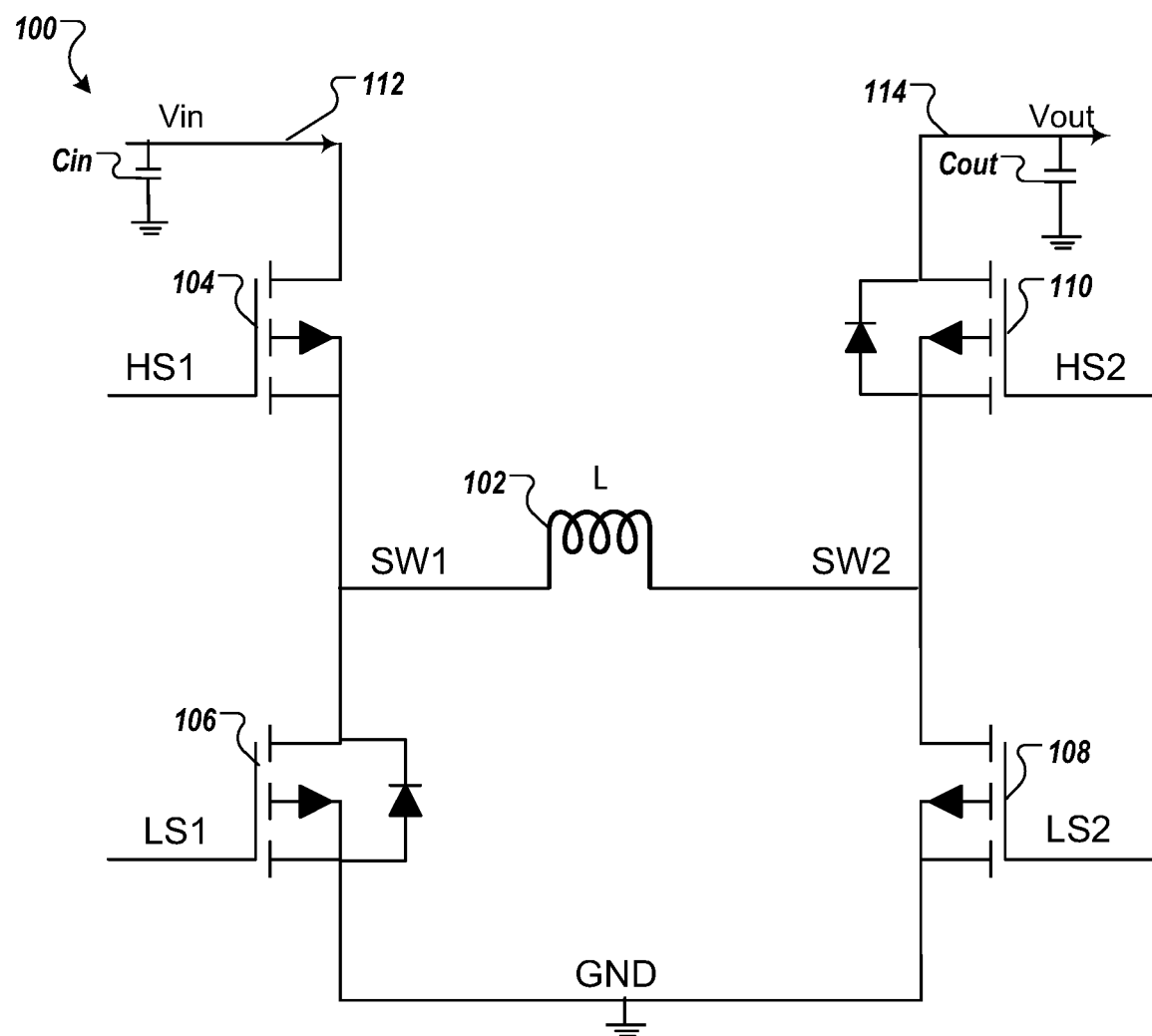
FIG. 1 is a schematic diagram of a buck-boost converter in at least one embodiment.

The following description sets forth numerous specific details such as examples of specific systems, components, methods, and so forth, in order to provide a good understanding of various embodiments of high-voltage tolerant, high-speed reverse current detection and protection for USB Type-C controllers as described herein. It will be apparent to one skilled in the art, however, that at least some embodiments may be practiced without these specific details. In other instances, well-known components, elements, or methods are not described in detail or are presented in a simple block diagram format in order to avoid unnecessarily obscuring the subject matter described herein. Thus, the specific details set forth hereinafter are merely exemplary. Particular implementations may vary from these exemplary details and still be contemplated to be within the spirit and scope of the present embodiments.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Described herein are various embodiments of buck-boost converters for USB Type-C controllers with ZCD and RCD comparator circuits that can be disposed to operate in various electronic devices. Examples of such electronic devices include, without limitation, personal computers (e.g., laptop computers, notebook computers, etc.), mobile computing devices (e.g., tablets, tablet computers, e-reader devices, etc.), mobile communication devices (e.g., smartphones, cell phones, personal digital assistants, messaging devices, pocket PCs, etc.), connectivity and charging devices (e.g., cables, hubs, docking stations, adapters, chargers, etc.), audio/video/data recording and/or playback devices (e.g., cameras, voice recorders, hand-held scanners, monitors, etc.), and other similar electronic devices that can use USB interfaces for communication, battery charging, and/or power delivery.

As used herein, "USB-enabled" device or system refers to a device or system that includes, is configured with, or is otherwise associated with a USB connector interface. A USB-enabled electronic device may comply with at least one release of a Universal Serial Bus (USB) specification. Examples of such USB specifications include, without limitation, the USB Specification Revision 2.0, the USB 3.0 Specification, the USB 3.1 Specification, the USB 3.2 Specification and/or various supplements, versions and errata thereof. The USB specifications generally define the characteristics (e.g., attributes, protocol definition, types of transactions, bus management, programming interfaces, etc.) of a differential serial bus that are required to design and build standard communication systems and peripherals. For example, a USB-enabled peripheral device attaches to a USB-enabled host device through a USB port of the host device to form a USB-enabled system. A USB 2.0 port includes a power voltage line of 5V (denoted VBUS), a differential pair of data lines (denoted D+ or DP, and D− or DN), and a ground line for power return (denoted GND). A USB 3.0 port also provides the VBUS, D+, D−, and GND lines for backward compatibility with USB 2.0. In addition, to support a faster differential bus (the USB SuperSpeed bus), a USB 3.0 port also provides a differential pair of transmitter data lines (denoted SSTX+ and SSTX−), a differential pair of receiver data lines (denoted SSRX+ and SSRX−), a power line for power (denoted DPWR), and a ground line for power return (denoted DGND). A USB 3.1 port provides the same lines as a USB 3.0 port for backward compatibility with USB 2.0 and USB 3.0 communications, but extends the performance of the SuperSpeed bus by a collection of features referred to as Enhanced SuperSpeed.

A more recent technology for USB connectors, called USB Type-C (also referred to herein as "USB-C"), is defined in various releases and/or versions of the USB Type-C specification. The USB Type-C specification defines Type-C receptacle, Type-C plug, and Type-C cables that can support USB communications as well as power delivery over newer USB power delivery protocols defined in various revisions/versions of the USB-PD specification. Examples of USB Type-C functions and requirements may include, without limitation, data and other communications according to USB 2.0 and USB 3.0/3.1, electro-mechanical definitions and performance requirements for Type-C cables, electro-mechanical definitions and performance requirements for Type-C receptacles, electro-mechanical definitions and performance requirements for Type-C plugs, requirements for Type-C to legacy cable assemblies and adapters, requirements for Type-C-based device detection and interface configuration, requirements for optimized power delivery for Type-C connectors, etc. According to the USB Type-C specification(s), a Type-C port provides VBUS, D+, D−, GND, SSTX+, SSTX−, SSRX+, and SSRX−lines, among others. In addition, a Type-C port also provides a Sideband Use (denoted SBU) line for signaling of sideband functionality and a Configuration Channel (or communication channel, denoted CC) line for discovery, configuration, and management of connections across a Type-C cable. A Type-C port may be associated with a Type-C plug and/or a Type-C receptacle. For ease of use, the Type-C plug and the Type-C receptacle are designed as a reversible pair that operates regardless of the plug-to-receptacle orientation. Thus, a standard USB Type-C connector, disposed as a standard Type-C plug or receptacle, provides pins for four VBUS lines, four ground return (GND) lines, two D+ lines (DP1 and DP2), two D−lines (DN1 and DN2), two SSTX+ lines (SSTXP1 and SSTXP2), two SSTX−lines (SSTXN1 and SSTXN2), two SSRX+ lines (SSRXP1 and SSRXP2), two SSRX−lines (SSRXN1 and SSRXN2), two CC lines (CC1 and CC2), and two SBU lines (SBU1 and SBU2), among others.

Some USB-enabled electronic devices may be compliant with a specific revision and/or version of the USB-PD specification. The USB-PD specification defines a standard protocol designed to enable the maximum functionality of USB-enabled devices by providing more flexible power delivery along with data communications over a single USB Type-C cable through USB Type-C ports. The USB-PD specification also describes the architecture, protocols, power supply behavior, parameters, and cabling necessary for managing power delivery over USB Type-C cables at up to 100 W of power. According to the USB-PD specification, devices with USB Type-C ports (e.g., such as USB-enabled devices) may negotiate for more current and/or higher or lower voltages over a USB Type-C cable than are allowed in older USB specifications (e.g., such as the USB 2.0 Specification, USB 3.1 Specification, the USB Battery Charging Specification Rev. 1.1/1.2, etc.). For example, the USB-PD specification defines the requirements for a power delivery contract (PD contract) that can be negotiated between a pair of USB-enabled devices. The PD contract can specify both the power level and the direction of power transfer that can be accommodated by both devices, and can be dynamically re-negotiated (e.g., without device un-plugging) upon request by either device and/or in response to various events and conditions, such as power role swap, data role swap, hard reset, failure of the power source, etc. As used herein, "USB-PD subsystem" refers to one or more logic blocks and other analog/digital hardware circuitry, which may be controllable by firmware in an IC controller and which is configured and operable to perform the functions and to satisfy the requirements specified in at least one release of the USB-PD specification. The IC controller can be implemented in a USB Type-C device. The IC controller can be implemented in a USB device.

Power delivery in accordance with the USB-PD specification(s) can be embodied in several different types of USB Type-C applications. Examples of such types of Type-C applications include, but may not be limited to: a downstream facing port (DFP) application, in which an IC controller with a USB-PD subsystem is configured to provide a downstream-facing USB port (e.g., in a USB-enabled host device); an upstream facing port (UFP) application, in which an IC controller with a USB-PD subsystem is configured to provide an upstream-facing USB port (e.g., in a USB-enabled peripheral device or adapter); a dual role port (DRP) USB application, in which an IC controller with a USB-PD subsystem is configured to support both DFP and UFP applications on the same USB port (e.g., a USB Type-C port that is configured to operate as either a power provider or a power consumer or can alternate between these two roles dynamically by using USB-PD power role swap); and an active cable application, in which an IC controller with a USB-PD subsystem is disposed into, and configured to operate, an electronically marked cable assembly (EMCA) Type-C cable.

A USB-C/PD power supply can be used to deliver power with a wide output voltage range of 3.3V-21.5V, a wide current range of 1 A-5 A, and a wide input supply voltage range of 5.0V to 24V, as per USB-C/PD protocol. Due to this wide voltage/current range for USB-C power delivery and rapid switching requirements between input and output voltage signals, a buck-boost (BB) converter can be employed with or within a USB Type-C controller, which can be controlled to provide power to expected output loads.

FIG. 1 is a schematic diagram of a buck-boost (BB) converter 100 in at least one embodiment. The BB converter 100 includes an inductor 102, a first high-side switch 104 (or HS1), a second high-side switch 110 (or HS2), a first low-side switch 106 (or LS1), and a second low-side switch 108 (or LS2). In one embodiment, these switches are n-type field effect transistors (NFETs), as illustrated. In another embodiment, although not illustrated, the high side switches are p-channel field effect transistors (PFETs).

In various embodiments, the first high-side switch 104 is coupled between an input terminal 112 and a first side (or input) of the inductor 102 of the BB converter 100. The second high-side switch 110 is coupled between a second side (or output) of the inductor 102 and an output terminal 114. The first low-side switch 106 is coupled between the input of the inductor 102 and a ground of the BB converter 100. The second low-side switch 108 is coupled between the output of the inductor 102 and the ground. The input terminal 112 can carry an input voltage (Vin) and the output terminal can carry an output voltage (Vout) of the BB converter 100. The BB converter 100 can further include an input capacitor (Cin) coupled to the input terminal 112 and an output capacitor (Cout) coupled to the output terminal 114. In some embodiments, the buck-boost converter 100 is capable of voltage swings of 20 volts or greater at an input and at an output of the inductor 102 of the buck-boost converter 100.

For such a BB converter 100, the input capacitor (Cin), output capacitor (Cout), and the inductor 102 can be designed based on input, output, and load current requirements. In various embodiments, the design of the BB converter 100 (or a larger system or device that includes the BB converter 100) seeks to limit the maximum current to a certain amperage and wattage requirement. Once total output power range is known, one can determine input current requirements. From input current requirements, one can determine values for capacitance of the input and output capacitors (Cin and Cout) and for the inductance of the inductor 102.

Figure 2:
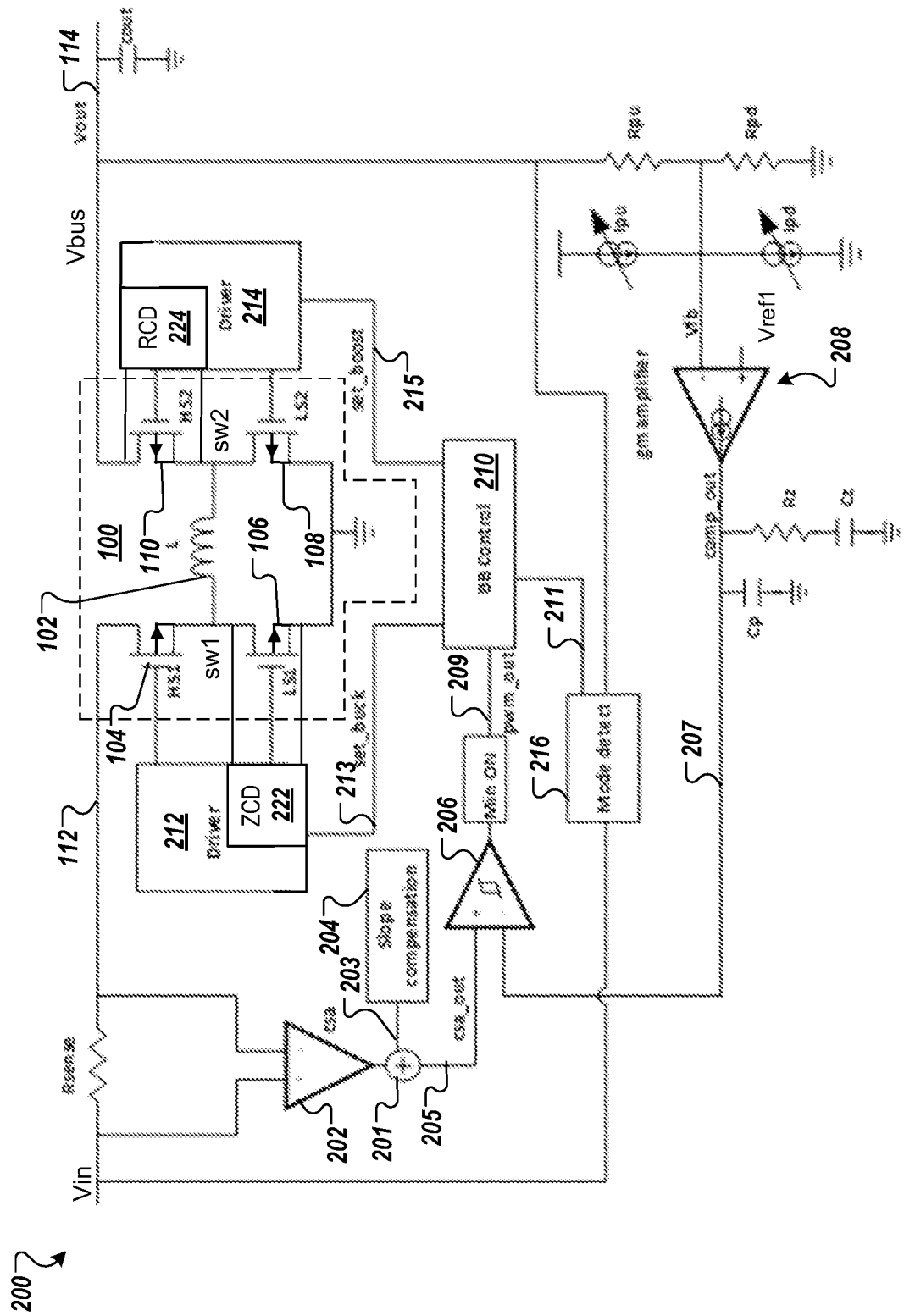
FIG. 2 is a schematic block diagram of a USB controller that includes a buck-boost converter architecture according to at least one embodiment.

FIG. 2 is a block diagram of a USB controller 200 coupled to a buck-boost converter 100 in at least one embodiment. The USB controller 200 includes a current sense amplifier (CSA) 202, a slope compensation circuit 204, a comparator 206, an error amplifier (EA) 208, BB control logic 210, a gate driver buck converter 212, a gate driver boost converter 214, and mode detect logic 216. The CSA 202 can measure an input current of buck-boost converter 100 and can output a CSA signal 201 indicative of the input current. The slope compensation circuit 204, which can include slope compensation logic and a slope compensation capacitor, is coupled to an output of CSA 202. The slope compensation circuit 204 can add an offset signal 203 (slope compensation offset) to CSA signal 201 when enabled, generating an offset CSA signal 205. In some cases, the offset signal 203 is a current or a charge. In other cases, the offset signal 203 can be a voltage signal if other circuits are used to add the offset signal 203 to CSA signal 201.

In various embodiments, the comparator 206 receives the offset CSA signal 205 and an EA signal 207 from the EA 208. The EA 208 compares the output voltage (Vout) at the output terminal 114 against a voltage reference to generate the EA signal 207. The comparator 206 compares the offset CSA signal 205 and EA signal 207 and provides a control signal 209, referred to as pulse width modulation (PWM) output signal (pw_out), to the BB control logic 210. The BB control logic 210 receives the control signal 209 and a mode signal 211 from the mode detect logic 216. The mode detect logic 216 can determine a mode and a transition between modes based on Vout and Vin and outputs the mode signal 211 accordingly. The BB control logic 210 uses the control signal 209 and mode signal 211 to control a mode of the buck-boost converter 100. In particular, the BB control logic 210 can send a first control signal 213 to the gate driver buck converter 212 that controls the first high-side switch 104 and the first low-side switch 106 of the buck-boost converter 100. The BB control logic can further send a second control signal 215 to the gate driver boost converter 214 that controls the second high-side switch 110 and the second low-side switch 108 of the buck-boost converter 100.

In at least one embodiment, mode detect logic 216 receives and measures Vout (at the output terminal 114) and Vin (at the input terminal 112) and determines whether Vin meets or exceeds a first threshold associated with Vin approaching Vout, such as in a mode transition from BB-Boost mode to BB-Buck mode. In at least one embodiment, mode detect logic 216 determines whether Vout meets or exceeds a second threshold associated with Vout approaching Vin, such as in a mode transition from BB-Buck mode to BB-Boost mode. Alternatively, mode detect logic 216 can determine whether buck-boost converter 100 is in boost mode or buck mode based on Vout and Vin.

As described herein, a USB-C/PD power supply can be used to deliver power with wide output voltage range of 3.3V-21.5V with input supply range from 5.0V to 24V and the USB PD specification has a requirement that the USB-C/PD power supply meets an output voltage (Vout) within +/−5% during line (Vin) transient and maintain Vout monotonicity during transitioning from one voltage to another. Whenever there is a large change in Vin or Vout, a power converter goes through different modes like Buck mode, BB-buck mode, BB-boost mode, or Boost mode, and the duty cycle (Ton/Tsw) is to be changed instantaneously during these mode-transitions, otherwise it would result in large undershoot/overshoot on Vout and fail the USB-PD specification requirements. For example, mode-transition from BB-Boost to BB-Buck, duty cycle should be changed from 15% to 85%.

In some embodiments, when a direct current (DC)-to-DC converter works in discontinuous conduction mode (DCM) mode, the inductor current may go negative, e.g., the inductor current can flow in reverse direction from Vout to Vin or to ground, which can cause efficiency loss. In order to ensure there is no negative inductor current flow (e.g., through the inductor 102), reverse current protection can be employed as will be explained.

In buck mode, according to various embodiments, the negative inductor current can flow from Vout to ground when the first low-side switch 106 is ON. Thus, the gate driver buck converter 212 can include a zero crossing detection (ZCD) comparator 222, which detects when current becomes zero through the first low-side switch 106 and turns off the first low-side switch 106 in response to detecting the zero current flow through the first low-side switch 106. The zero current detection can be performed by the ZCD comparator 222 sensing inputs that include a ground node and an input (sw1) to the inductor 102. The sensing may be performed when the voltage at the input (or sw1 node) is higher than the ground voltage and thus current is flowing in reverse direction through the first low-side switch 106 when the zero current condition is detected.

In boost mode, according to various embodiments, the negative inductor current can flow from Vout to Vin or ground when the second high-side switch 110 is ON. Thus, the gate driver boost converter 214 can include a reverse current detection (RCD) comparator 224 that detects when current becomes zero through the second high-side switch 110 and turns off the second high-side switch 110 in response to detecting the zero current flow through the second high-side switch 110. The reverse current detection can be performed by the RCD comparator 224 sensing inputs including the output voltage (Vout) and an output (sw2) of the inductor 102. The sensing may be performed when the voltage at the output (or sw2 node) is lower than Vout, and thus current is flowing in reverse direction through the second high-side witch 110.

In various embodiments, since switch resistance is in order of 5 milliohms (me), so the ZCD and RCD comparators 222 and 224 are to detect voltage differences of approximately 1 mV. Also, the negative inductor slope current can be very high (7 A/µs) so these the ZCD and RCD comparators 222 and 224 can also detect the current within a time range of between approximately 5-20 nanoseconds (ns). In one embodiment, the time range for detection is 10 ns.

The input (or sw1 node) to the inductor 102 can switch from 0 to 24V (maximum operating voltage of Vin) whereas the output (or sw2 node) of the inductor 102 can switch from 0 to 22V (maximum operating voltage of Vout), hence the ZCD and RCD comparators 222 and 224 are high voltage complaint as well. Other voltage switches ranges are envisioned in different applications. Further, an sw1 common mode voltage is 0V for ZCD, while an sw2 common mode can vary between approximately 3.3V to 22V for RCD (the operating voltage range of Vout) when detecting zero current.

Figure 3A:
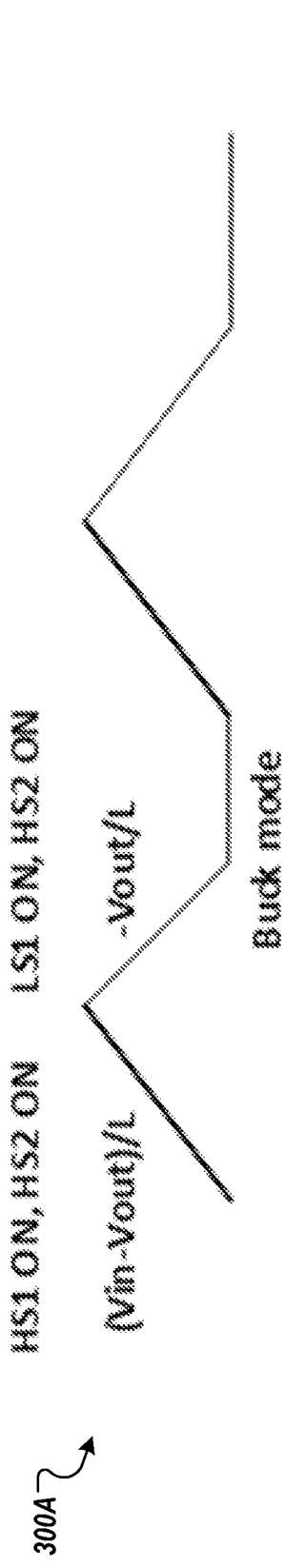
FIG. 3A is an inductor current profile of the buck-boost converter in buck mode according to an least one embodiment.

FIG. 3A is an inductor current profile of the buck-boost converter 100 in buck mode according to an least one embodiment. The current profile alternates in waveform that includes a positive slope defined by Vin-Vout divided by the inductance value (L) of the inductor 102 of the buck-boost converter 100. This first, positive slope region occurs when the first high-side switch 104 and the second high-side switch 110 are ON. The current profiles then transition to negative current slope of -Vout over the inductance value until reaching a zero current value, e.g., when the USB controller 200 transitions to turning ON the first low-side switch 106 and turning OFF the first high-side switch 104 (while the second high-side switch 110 remains ON). After the inductor current of the buck-boost converter 100 reaches zero, where the first low-side switch 106 is turned off when the ZCD comparator 222 detects zero current, the current remains at zero until cycling back into a positively sloped current when the first side switches toggle and repeating the waveform of the current profile.

Figure 3B:
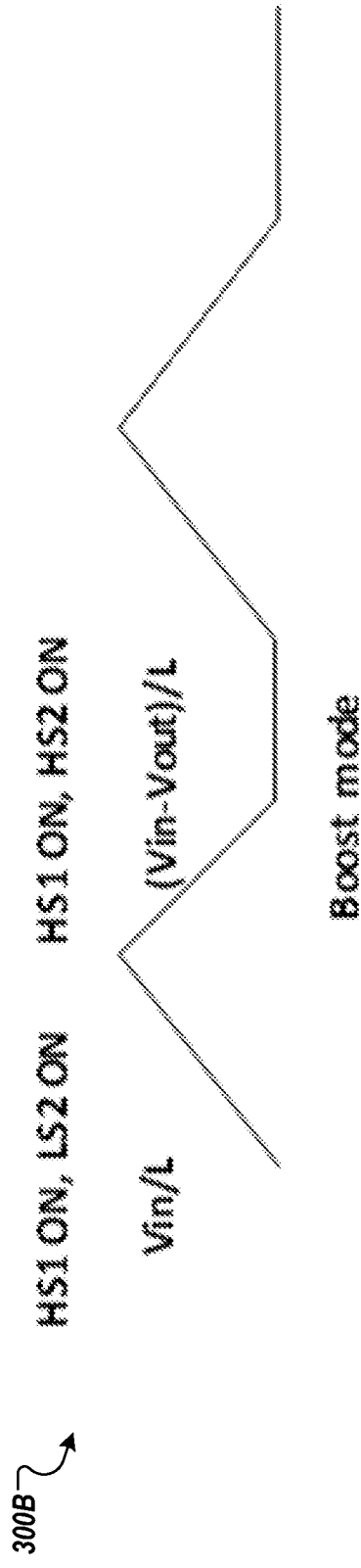
FIG. 3B is an inductor current profile in the buck-boost converter in boost mode according to an least one embodiment.

FIG. 3B is an inductor current profile in the buck-boost converter in boost mode according to an least one embodiment. The current profile alternates in waveform that includes a positive slope defined by Vin divided by the inductance value (L) of the inductor 102 of the buck-boost converter 100. This first, positive slope region occurs when the first high-side switch 104 and the second low-side switch 108 are ON. The current profiles then transition to negative current slope of (Vin-Vout)/L until reaching a zero current value, e.g., when the USB controller 200 transitions to turning ON the second high-side switch 110 and turning OFF the second low-side switch 108. After the inductor current of the buck-boost converter 100 reaches zero, where the second high-side switch 110 is turned OFF when the RCD comparator 224 detects zero current, the current remains at zero until cycling back into a positively sloped current when the second side switches toggle and repeating the wave of the current profile.

Figure 4A:
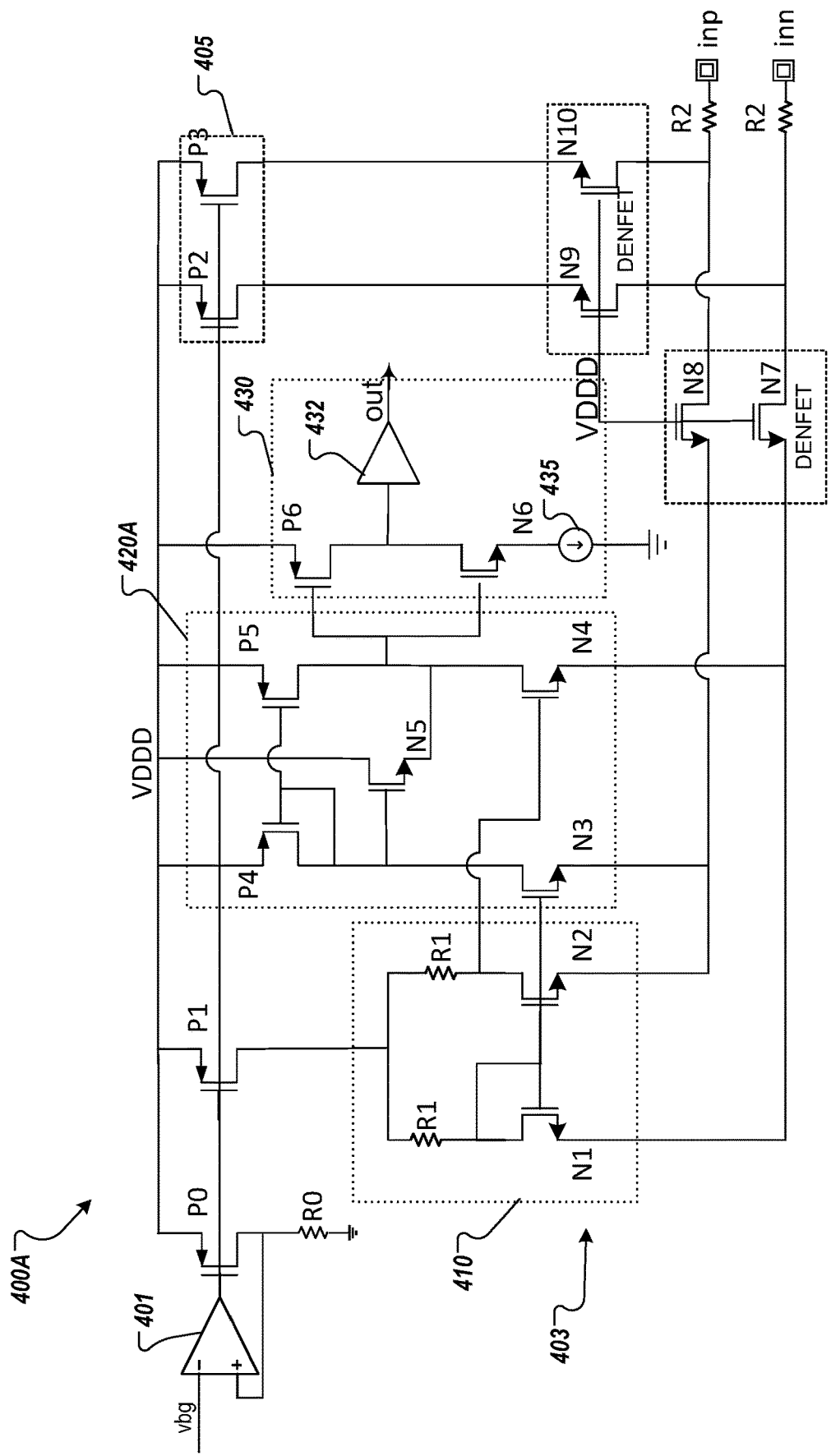
FIG. 4A is a schematic diagram of a zero crossing detection (ZCD) comparator circuit according to at least an embodiment.

FIG. 4A is a schematic diagram of a zero cross detection (ZCD) comparator circuit 400A according to at least an embodiment. In some embodiments, the ZCD comparator 222 (FIG. 2) is implemented as the ZCD comparator circuit 400A. In at least one embodiment, the ZCD comparator circuit 400A includes a negative input (inn) coupled to a ground of the buck-boost converter 100, a positive input (inp) coupled to an input (sw1) of the inductor 102 of the buck-boost converter 100, and an output ("out") coupled to a gate of the first low-side switch 106 of the buck-boost converter 100. A value at the output can be asserted in response to detecting a zero current flow through the first low-side switch 106 while the buck-boost converter 100 operates in buck mode, for example.

In this at least one embodiment, the ZCD comparator circuit 400A further includes a first resistor (R2) coupled to the negative input and a second resistor (R2) coupled to the positive input. In some embodiments, the first resistor has a substantially identical resistance as the second resistor. In some embodiments, the first resistor and the second resistor are variable resistors, which are adjustable for trimming and/or setting the detection threshold, as will be discussed in more detail.

In this at least one embodiment, the ZCD comparator circuit 400A further includes a first drain-extended n-type transistor (DENFET) (N7) coupled to the first resistor and a second DENFET (N8) coupled to the second resistor, where gates of the first and second DENFETs are coupled to a supply voltage (VDDD). The DENFETs disclosed herein can provide high-voltage tolerance and high-voltage protection to other circuitry of the comparators circuits. The ZCD comparator circuit 400A can further include an operational amplifier 401 including: a second positive input coupled to ground through a third resistor (R0), a second negative input that receives (or is coupled to) a bandgap voltage reference (Vbg), and a second output. In various embodiments, a bandgap voltage reference is generated by a temperature independent voltage reference circuit sometimes employed in integrated circuits. Such a circuit produces a fixed voltage regardless of power supply variations, temperature changes, or circuit loading from a device, and thus provides a precision voltage reference. The ZCD comparator circuit 400A can further include a multi-stage amplifier 403 coupled between the second output of the operational amplifier 401, the first and second DENFETs, and the output.

In the at least one embodiment, the ZCD comparator circuit 400A further includes a p-type metal-oxide-semiconductor (PMOS) transistor (P1) having a gate coupled to the second output, a source coupled to the supply voltage (VDDD), and a drain coupled to a first stage 410 of the multi-stage amplifier 403. The ZCD comparator circuit 400A can further include the third resistor (R0) and a second PMOS transistor (P0) that includes a source coupled to the supply voltage, a drain coupled to the third resistor (R0), and a gate coupled to the second output. In some embodiments, the PMOS transistors discussed herein are PFETs.

In the at least one embodiment, the ZCD comparator circuit 400A further includes a third DENFET (N9) coupled to the negative input and a fourth DENFET (N10) coupled to the positive input. The ZCD comparator circuit 400A further includes a current mirror multiplier 405 coupled between the second output (and also gates of the P0 and P1 PMOS transistors) and the third and fourth DENFETs (N9 and N10). The current mirror multiplier 405 can include a bank of PMOS transistors (e.g., P2, P3, and more) that are selectable to adjust a reference current at the second output of the operational amplifier 401. This reference current (Iref) can be understood to be Vbg/R0. Thus, the current mirror multiplier 405 can be programmed (e.g., via selection of one or more PMOS transistors of the bank of PMOS transistors) to make fine adjustments to either the negative input (inn) or the positive input (inp), which improves the speed of the ZCD comparator circuit 400A while providing precision in threshold voltage/current values.

In at least one embodiment, the current mirror multiplier 405 includes a first PMOS transistor (P2) that includes a source coupled to the supply voltage (VDDD), a drain coupled to the third DENFET (N9), and a gate coupled to the second output of the operational amplifier 401. The current mirror multiplier 405 can further include a second PMOS transistor (P3) that includes a source coupled to the supply voltage (VDDD), a drain coupled to the fourth DENFET (N10), and a gate coupled to the second output.

Only by way of example, assume a generated current of I0=Vbg/R0 flows though P1 (having a size of W/L), through P2 (having a size of K1*W/L), and through P3 (having a size of K2*W/L), where constants K1 and K2 are programmable multipliers of the current mirror multiplier 405. When injecting fine current of Iref=K1*I0 to the first negative input (inn), the BB control logic 210 can set K1 as required and K2 to zero ("0"). Similarly, to inject fine current of Iref=K2*I0 to the first positive input (inp), the control logic 210 can set K2 as required and K1 to zero ("0").

In the at least one embodiment, the multi-stage amplifier 403 includes a first stage amplifier 410 coupled to the second output, a second stage amplifier 420A coupled to the first stage amplifier 410, and an output stage 430 coupled between the second stage amplifier 420A and the output ("out"). In at least one embodiment, the first stage amplifier 410 includes a first path coupled to the first DENFET (N7). This first path can include, in series, a fourth resistor (R1) and a first n-type metal-oxide-semiconductor (NMOS) transistor (N1), where a gate of the first NMOS transistor (N1) is coupled to a drain of the first NMOS transistor (N1). The first stage amplifier 410 can further include a second path coupled to the second DENFET (N8). The second path can include, in series, a fifth resistor (also R1) and a second NMOS transistor (N2), where gates of the first and second NMOS transistors are connected. The fourth resistor and the fifth resistor (both indicated as R1) can have substantially identical resistances. In some embodiments, the output voltage swing of the first stage amplifier 410 is kept limited around the input common mode voltage of the second stage amplifier 420A using R1 to improve the response time of first stage amplifier 410. In some embodiments, the NMOS transistors discussed herein are NFETs.

Accordingly, the threshold voltage (Vth) of the ZCD comparator circuit 400A can be written as R2(K1*Iref− K2*Iref). When replacing Iref with $$\frac{vbg}{R0},$$

Vth can be rewritten as $$\frac{R2*(K1-K2)*vbg}{R0}.$$

Because resistors R0, R1, and R2 are similar type of on-chip resistors, which have substantially identical temperature coefficients, temperature variation of R2 and R0 would cancel each other and $$Vth = \frac{R2*(K1-K2)*vbg}{R0}$$

can be understood to be independent of temperature variation.

In the at least one embodiment, the second stage amplifier 420A includes a third path that includes, in series, a first PMOS transistor (P4) and a third NMOS transistor (N3), where the first PMOS transistor (P4) has a source coupled to a supply voltage (VDDD), a drain coupled to a drain of the third NMOS transistor, and a gate coupled to the drain. The third NMOS transistor (N3) can have a source coupled to the second DENFET (N8) and a gate coupled to gates of the first and second NMOS transistors (N1 and N2). The second stage amplifier 420A can further include a fourth path that includes, in series, a second PMOS transistor (P5) and a fourth NMOS transistor (N4), where the second PMOS transistor has a source coupled to the supply voltage, a drain coupled to a drain of the fourth NMOS transistor (N4), and a gate coupled to the gate of the first PMOS transistor (P4). The fourth NMOS transistor (N4) can include a source coupled to the first DENFET and a gate coupled to the drain of the second NMOS transistor. The second stage amplifier 420A can include a fifth NMOS transistor (N5) that has a drain coupled to the supply voltage, a source coupled to drains of the second PMOS transistor (P5) and the fourth NMOS transistor (N4), and a gate coupled to the drain of the first PMOS transistor (P4).

In the at least one embodiment, the output stage 430 of the multi-stage amplifier 403 includes a third PMOS transistor (P6) coupled in series with a sixth NMOS transistor (N6), where the third PMOS transistor (P6) has a source coupled to a supply voltage (VDDD), a drain coupled to a drain of the sixth NMOS transistor (N6) and to an output buffer 432, which is in turn coupled to the output ("out"). Further, in this embodiment, the sixth NMOS transistor (N6) has a source coupled to a current source 435, which is coupled to the ground, where gates of the third PMOS transistor (P6) and the sixth NMOS transistor are coupled to the second stage amplifier 420A. The output voltage swing of the second stage amplifier 420A can be clamped around Vthp (the p-type MOS threshold voltage) of the third PMOS transistor (P6) of current starved inverter using the NMOS source follower (N5) to improve speed.

Figure 4B:
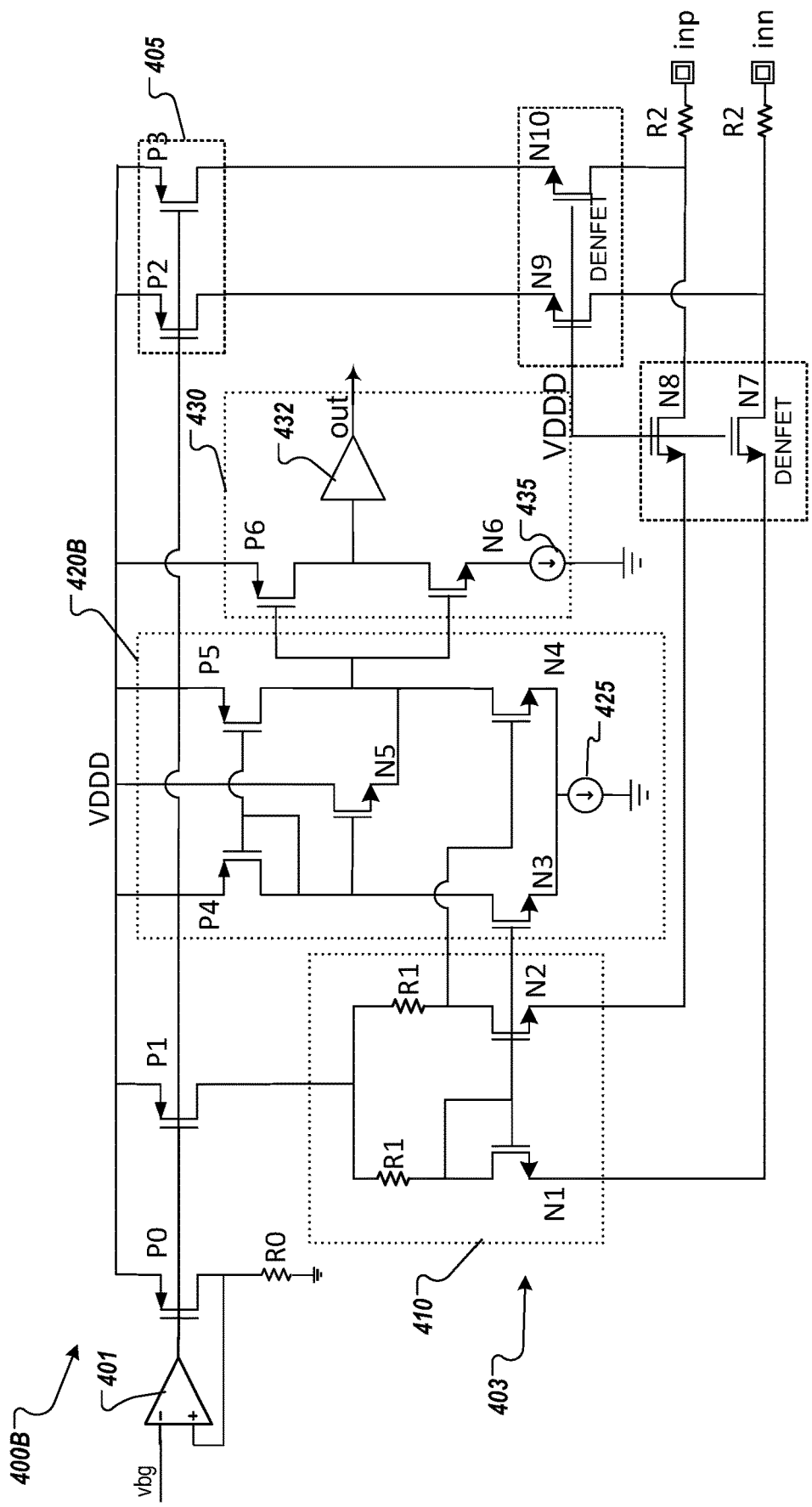
FIG. 4B is a schematic diagram of a ZCD comparator circuit according to an alternative embodiment.

FIG. 4B is a schematic diagram of a ZCD comparator circuit 400B according to an alternative embodiment. The ZCD comparator circuit 400B is substantially the same as the ZCD comparator circuit 400A, except for a variation in a second stage amplifier 420B compared to the second stage amplifier 420A. In this embodiment, the sources of the third NMOS transistor (N3) and the fourth NMOS transistor (N4) are instead joined and coupled to a constant current bias 425 in order to provide pin leakage current reduction at the sources of N3 and N4.

Figure 5A:
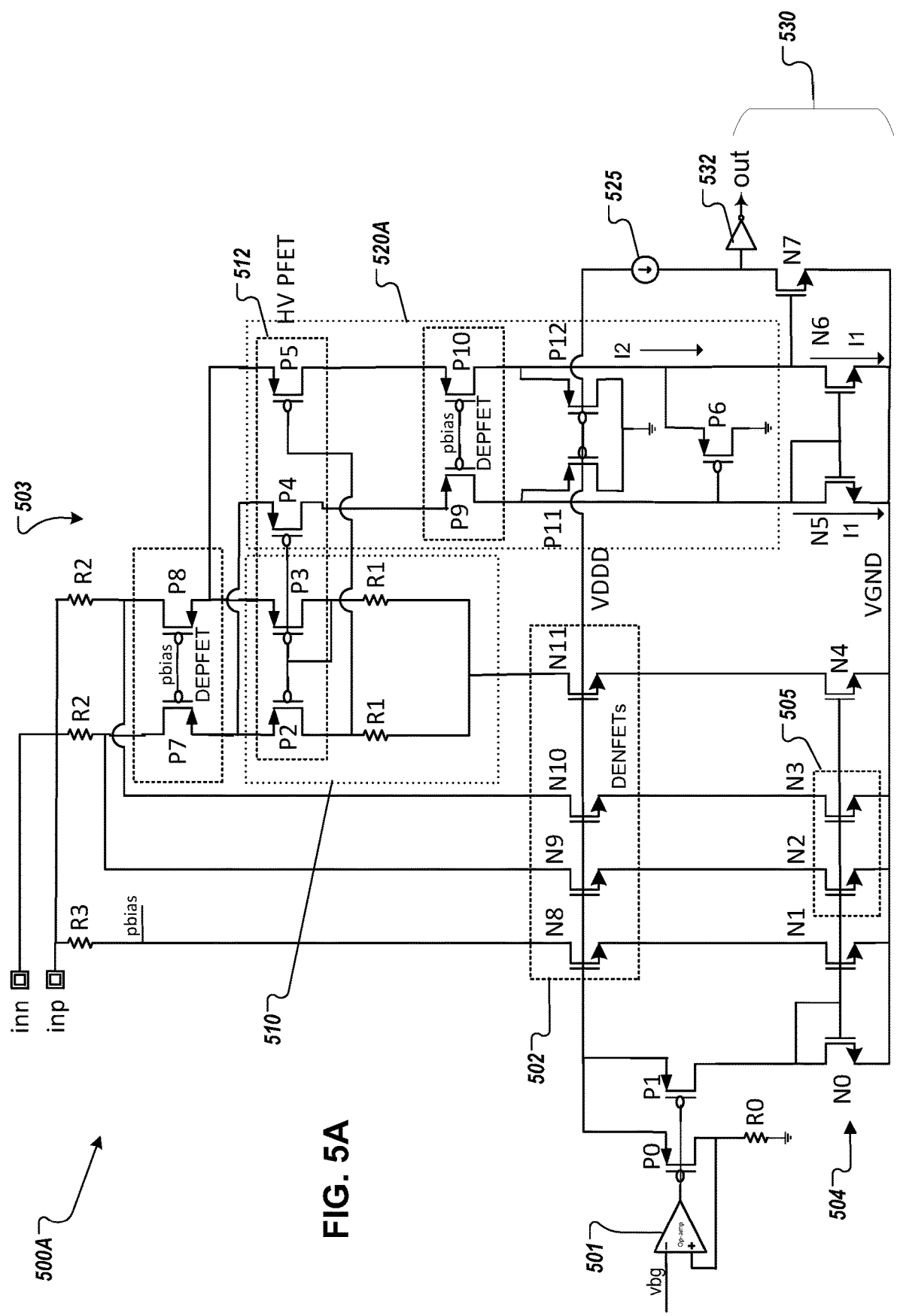
FIG. 5A is a schematic diagram of a reverse current detection (RCD) comparator circuit according to at least one embodiment.

FIG. 5A is a schematic diagram of a reverse current detection (RCD) comparator circuit 500A according to at least one embodiment. In some embodiments, the RCD comparator 224 (FIG. 2) is implemented as the RCD comparator circuit 500A. In at least one embodiment, the RCD comparator circuit 500A includes a negative input (inn) coupled to an output of an inductor of the buck-boost converter 100, a positive input (inp) coupled to a voltage bus (Vbus) output of the buck-boost converter 100, and an output ("out") coupled to a gate of the second high-side switch 110 of the buck-boost converter. In an embodiment, a value at the output is to be asserted in response to detecting a zero current flow through the second high-side switch 110 while the buck-boost converter 100 operates in boost mode.

In the at least one embodiment, the RCD comparator circuit 500A further includes a first resistor (R2) coupled to the negative input (inn) and a second resistor (R2) coupled to the positive input (inp). In some embodiments, the first resistor has a substantially identical resistance as the second resistor. In some embodiments, the first resistor and the second resistor are variable resistors, which are adjustable to set a detection threshold current.

In the at least one embodiment, the RCD comparator circuit 500A further includes a first drain-extended p-type transistor (DEPFET) (P7) coupled to the first resistor and a second DEPFET (P8) coupled to the second resistor, where gates of the first and second DEPFETs are coupled together. The RCD comparator circuit 500A can further include an operational amplifier 501 that includes a second positive input coupled to a ground through a third resistor (R0), a second negative input receiving (or coupled to) a bandgap voltage reference (Vbg), and a second output. In various embodiments, a bandgap voltage reference is generated by a temperature independent voltage reference circuit sometimes employed in integrated circuits. Such a circuit produces a fixed voltage regardless of power supply variations, temperature changes, or circuit loading from a device, and thus provides a precision voltage reference. The RCD comparator circuit 500A can further include a multi-stage amplifier 503 coupled between the second output of the operational amplifier 501, the first and second DEPFETs (P7 and P8), and the output ("out").

In various embodiments, a reference current (Iref) of the RCD comparator circuit 500A can be determined by Vbg/R0 from one of the inputs (inn or inp), to set a detection threshold voltage depending on the current direction through the second high-side switch 110. Thus, the detection threshold voltage can be determined as Vbg*R2/R0.

In the at least one embodiment, the RCD comparator circuit 500A further includes a p-type metal-oxide-semiconductor (PMOS) transistor (P1) having a gate coupled to the second output, a source coupled to the supply voltage (VDDD), and a drain coupled to a current mirror. In the at least one embodiment, the RCD comparator circuit 500A further includes the third resistor (R0) and a second PMOS transistor (P0) that includes a source coupled to the supply voltage (VDDD), a drain coupled to the third resistor (R0), and a gate coupled to the second output.

In the at least one embodiment, the RCD comparator circuit 500A further includes a set of drain-extended n-type transistors (DENFETs) 502 each having a gate coupled to the supply voltage (VDDD). In some embodiments, the set of DENFETs 502 includes a first DENFET (N8) having a drain coupled to the positive input (inp), e.g., though a resistor (R3), a second DENFET (N9) having a drain coupled to the first resistor (R2), a third DENFET (N10) having a drain coupled to the second resistor (R2), a fourth DENFET (N11) having drain coupled to a first stage amplifier 510 of the multi-stage amplifier 503. The DEPFETs and the DENFETs disclosed herein can provide high-voltage tolerance and high-voltage protection to other circuitry of the comparators circuits.

In the at least one embodiment, the RCD comparator circuit 500A further includes a set of n-type metal-oxide-semiconductor (NMOS) transistors 504 having gates coupled together and each including a source coupled to ground. In some embodiments, the set of NMOS transistors 504 includes a first NMOS transistor (N0) having a drain coupled to a drain of the PMOS transistor (P1) and to a gate of the first NMOS transistor (N0), the PMOS transistor (P1) having a source coupled to the supply voltage and a gate coupled to the second output. The set of NMOS transistors 504 can further include a second NMOS transistor (N1) having a drain coupled to a source of the first DENFET (N8) and a gate coupled to the gate of the first NMOS transistor (N0). The set of NMOS transistors 504 can further include a third NMOS transistor (N2) having a drain coupled to a source of the second DENFET (N9), a fourth NMOS transistor (N3) having a drain coupled to a source of the third DENFET (N10), and a fifth NMOS transistor (N4) having a drain coupled to a source of the fourth DENFET (N11).

In some embodiments, the third and fourth NMOS transistors (N2 and N3) are a current mirror multiplier 505 that further includes a bank of NMOS transistors (not all illustrated) that are selectable to adjust a reference current at the second output of the operational amplifier. By using the current mirror multiplier 505, there is less of a need for a resistor network, making the RCD comparator circuit 500A faster. Further, injected current from the current mirror multiplier 505 is trimmed by selectively choosing one or more NMOS transistors of the bank of NMOS transistors (e.g., N2, N3, and more).

In at least one embodiment, the first stage amplifier 510 of the multi-stage amplifier 503 includes a first path coupled to the first DEPFET (P7). This first path can include, in series, a first high-voltage p-type field-effect transistor (PFET) (P2) and a fourth resistor (R1). The first stage amplifier 510 can further include a second path coupled to the second DEPFET (P8). This second path can include, in series, a second high-voltage PFET (P3) and a fifth resistor (R1). A drain of the second high-voltage PFET (P3) can be coupled to a gate of the second high-voltage PFET (P3). In at least one embodiment, the first and second high-voltage PFETs (P2 and P3) are among a set of high-voltage PFETs 512 that mirror current into a second stage amplifier 520A of the multi-stage amplifier 503. Further, in at least one embodiment, the fourth resistor and the fifth resistor have substantially identical resistances, and gates of the first and second high-voltage PFETs (P2 and P3) are connected. In various embodiments, the output voltage swing of the first stage amplifier 510 is kept limited around an input common mode voltage of the second stage amplifier 520A using R1 to improve the response time of the first stage amplifier 510.

Accordingly, the threshold voltage (Vth) of the RCD comparator circuit 500A can be written as R2(K1*Iref− K2*Iref). When replacing Iref with $$\frac{vbg}{R0},$$

than Vth can be rewritten as $$\frac{R2*(K1-K2)*vbg}{R0}.$$

Because resistors R0, R1, and R2 are similar type of on-chip resistors, which have substantially identical temperature coefficients, temperature variation of R2 and R0 would cancel each other and $$Vth = \frac{R2*(K1-K2)*vbg}{R0}$$

can be understood to be independent of temperature variation.

In the at least one embodiment, the second stage amplifier 520A of the multi-stage amplifier 503 includes a third high-voltage PFET (P4) having a source coupled to the first DEPFET (P7) and a gate coupled to gates of the first and second high-voltage PFETs (P2 and P3). The second stage amplifier 520A can further include a fourth high-voltage PFET (P5) having a source coupled to the second DEPFET (P8) and a gate coupled to a drain of the first high-voltage PFET (P2). The second stage amplifier 520A a third DEPFET (P9) coupled to the third high-voltage PFET (P4), a fourth DEPFET (P10) coupled to the fourth high-voltage PFET (P5), where gates of the third and fourth DEPFET (P9 and P10) are coupled together. The second stage amplifier 520A can further include a first PMOS transistor (P11) having a source coupled to the third DEPFET (P9), a second PMOS transistor (P12) having a source coupled to the fourth DEPFET (P10), where gates of the first and second PMOS transistors are coupled to the supply voltage (VDDD), and drains of the first and second PMOS transistors are coupled to the ground. The second stage amplifier 520A can further include a third PMOS transistor (P6) having a source coupled to the source of the second PMOS transistor (P12), a drain coupled to the ground, and a gate coupled to the source of the first PMOS transistor (P11).

In the at least one embodiment, the RCD comparator circuit 500A further includes an output stage 530 of the multi-stage amplifier 503. In some embodiments, the output stage 530 includes a first n-type metal-oxide-semiconductor (NMOS) transistor (N5) having a drain coupled to the gate of the third PMOS transistor (P6), a gate coupled to the drain of the first NMOS transistor (N5), and a source coupled to the ground. The output stage 530 can further include a second NMOS transistor (N6) having a drain coupled to a source of the third PMOS transistor (P6), a gate coupled to the gate of the first NMOS transistor (N5), and a source coupled to the ground. The output stage 530 can further include a third NMOS transistor (N7) having a drain coupled to the supply voltage (VDDD) through a constant current bias 525, a gate coupled to the drain of the second NMOS transistor (N6), and a source coupled to the ground. The output stage 530 can further include an output inverted buffer 532 coupled between the drain of the third NMOS transistor and the output.

In some embodiments, the output swing of the second stage amplifier 520A is clamped around Vthn of NMOS N7 of a current starved inverter (made up of the first and second PMOS transistors P11 and P12 and the first and second NMOS transistors N5 and N6) using the third PMOS transistor (P6) as a source follower to improve speed. More specifically, assume the stack current through the second NMOS transistor (N6) has two current components, I1 and I2. When comparator input condition is such that the gate of the third NMOS transistor (N7) is supposed to be low, turning off N7. In this case, I1>I2, the source of P6 is equal to zero ("0"), and the gate voltage of P6 is ~VGS of N5, so P7 is also turned off. However, when the comparator input condition is such that the gate of N7 is supposed to be high, turning on N7. In this case, I1<I2, the gate voltage of N7 would try to go high, turning on N7. Once the gate of N7 goes higher than the turn-on threshold voltage of P6, P6 is turned on, and the extra current (I2−I1) flows through P6. At this point, the gate voltage of N7 clamps to (VGS of N5+VSG of P6). In this way, the output of the second stage amplifier 520A (a gate of N7) is restricted to low voltage swing, which helps to charge/discharge this node quickly and improve the speed/response time of the RCD comparator circuit 500A.

Figure 5B:
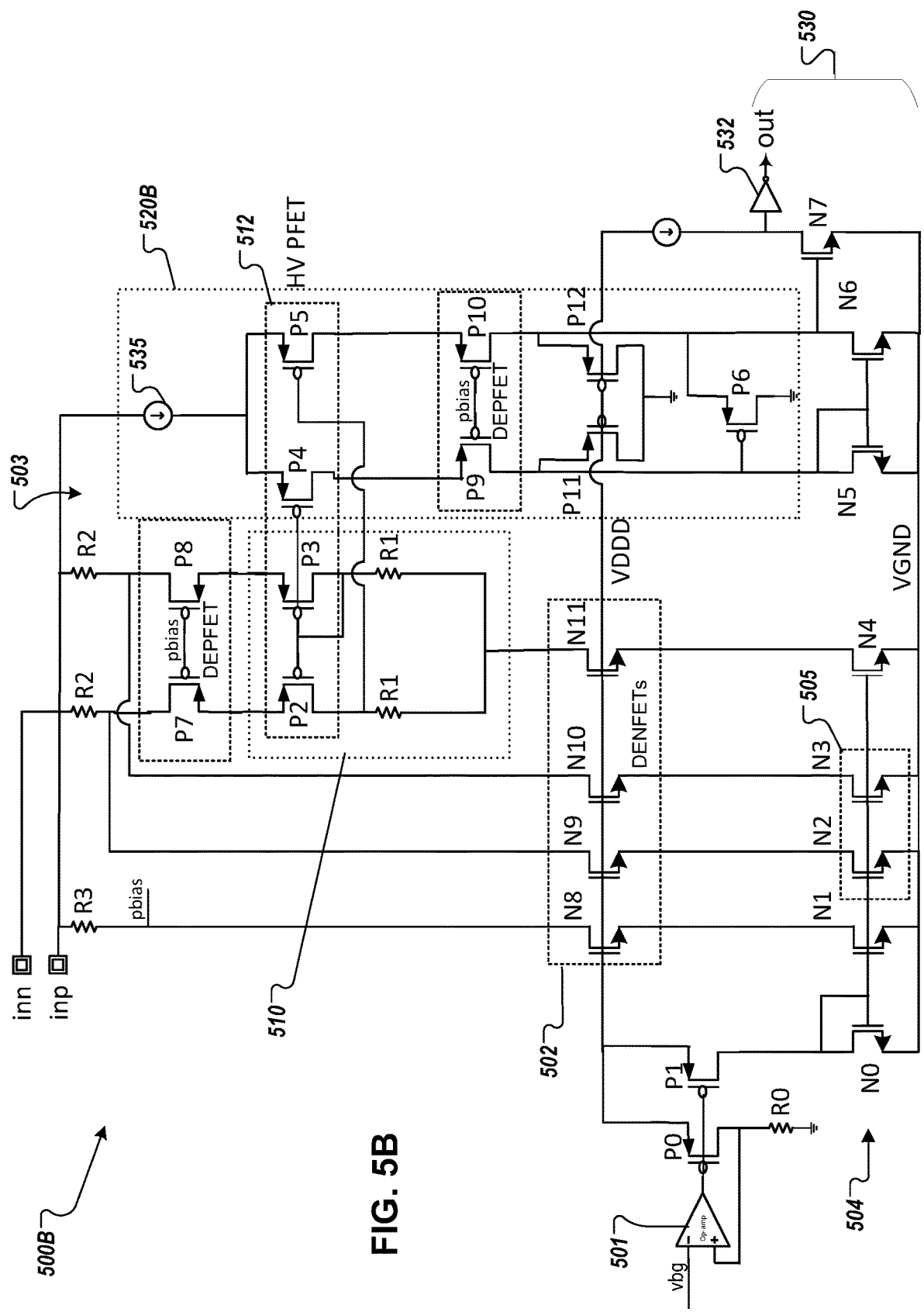
FIG. 5B is a schematic diagram of a RCD comparator circuit according to at an alternative embodiment.

FIG. 5B is a schematic diagram of a RCD comparator circuit 500B according to at an alternative embodiment. The RCD comparator circuit 500B is substantially the same as the RCD comparator circuit 500A, except for a variation in a second stage amplifier 520B compared to the second stage amplifier 520A. In this embodiment, the sources of the third and fourth high-voltage PFETs (P4 and P5) are instead joined and coupled to a constant current bias 525 to provide pin leakage current reduction at the sources of P4 and P5.

Buck-boost converters, such as the BB converter 100, are designed to either work in pulse-skip mode (PSM) or forced-continuous-conduction mode (FCCM). The PSM is a type of discontinuous conduction mode (DCM) in which the current through the buck-boost converter 100 reaches zero ("0") each cycle. Further, the FCCM is a type of continuous conduction mode (CCM) in which the current is continuous, but goes negative each cycle (potentially significantly negative). There exist certain challenges in protecting the circuitry in each of the PSM-based and FCCM-based operation of the BB converter 100.

More specifically, in FCCM, a negative or reverse current is allowed from Vout, and thus, circuitry can be added to the BB converter 100 to protect for large negative currents to avoid inductor saturation in the reverse direction. This generally includes adding circuitry for bi-directional current sensing at the output (Vout), e.g., in the form of an output side bi-directional sensing CSA. This sort of bi-directional current sensing, if implemented in hardware, adds complexity to the design of the USB controller 200 (or other device that incorporates the BB controller) as well as additional die area.

Further, in PSM, a reverse current from Vout to Vin (or ground) is to be avoided, thus requiring at least one of the ZCD comparator 222 (for the low side) or the RCD comparator 224 (for the high side) to protect the USB controller 200 from reverse current. Generally, the threshold voltages for the RCD comparator 224 and the ZCD comparator 222 are kept towards the positive side of the current curve to compensate for delay in sensing and turning-off of the external FETs. For example, a voltage of around 1-2 mV may need to be sensed by the RCD comparator 224 or the ZCD comparator 222, requiring accurate reverse current detection, which incurs a delay in being able to turn off the second high-side switch 110 or the first low-side switch 106, respectively. For a wide range of the input/output voltages of the USB controller 200, the slope of the current through the inductor 102 varies almost by 25 times (e.g., Vin−Vout/L=15V/L to (Vin−Vout)/L=0.6 V/L), causing large variation in the current at which switches will get turned off around reverse-current detection thresholds.

This large variation in current negatively impacts efficiency across Vin or Vout ranges and results in efficiency peak only at a particular Vin or Vout combination for DCM operation. For example, efficiency is loss as a result of either early switch-off (diode conduction) or late switch-off (reverse current) for a wide range of Vin or Vout values due to the wide range of inductor current slope. The offset to provide zero current detection can vary across corners and with temperature, and thus hardware designs have to be designed to cover the worst-case offsets that degrade efficiency for typical silicon-based designs. In order to improve efficiency, the RCD comparator 224 and the ZCD comparator 222 would need to be less than 1 mV accurate and exhibit a delay of less than 50 ns, which likewise significantly increases hardware design complexity and die area to implement.

To resolve these deficiencies in hardware designs, the BB control logic 210 can be adapted to enable programmable control of the functioning of the ZCD controller 222 and the RCD comparator 224, without adding further hardware. For example, at least three levels of programming can be applied to these comparators. First, enabling a programming range in threshold reference voltages in each comparator (e.g., between −14 mV and +14 mV) with at least a 0.6 mV resolution. Second, enabling a programming in which the range of the threshold reference voltages can be doubled (e.g., −28 mV to +28 mV) with a corresponding doubling in resolution (e.g., 1.2 mV). Although +/−14 mV and +/−28 mV are used as example, additional voltage ranges are envisioned. Third, the enabling and/or disabling of the ZCD comparator 222 (at LS1) or the RCD comparator 224 (at HS2) based on mode of operation.

The BB control logic 210 can include hardware that is programmable (or configurable) by firmware in the USB controller 200 in order to implement the functionality described herein. For example, the hardware of the BB control logic 210 can include synthesized (or digital) logic, read registers, multipliers, AND gates, OR gates, and the like. The programming of the hardware within the BB control logic 210 can be updated, such as after manufacturing and/or according to a customer set mode of operation.

Figure 6A:
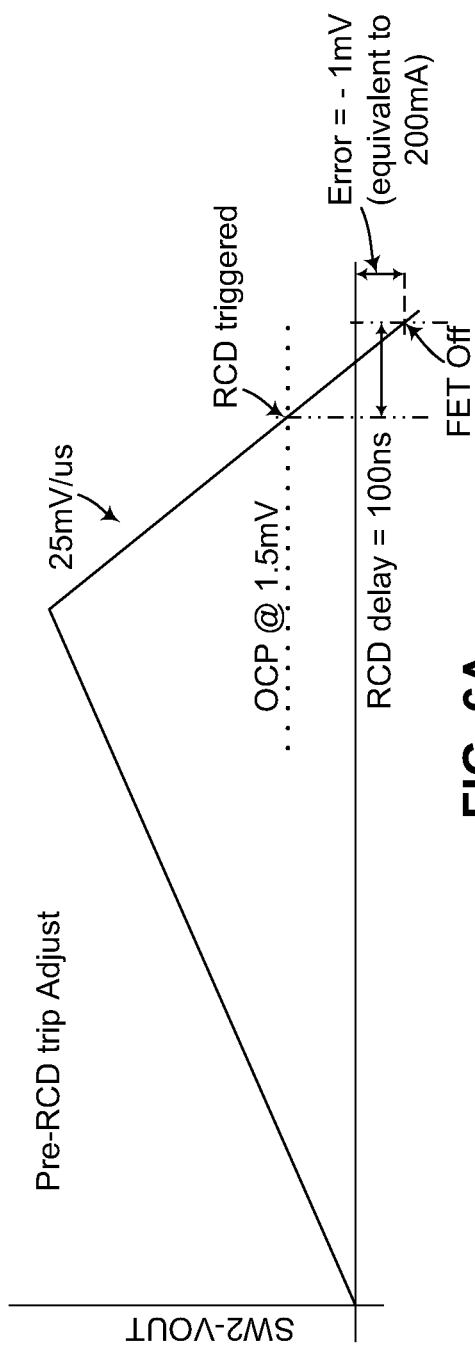
FIG. 6A is a graph of an example inductor output waveform that illustrates the need for triggering and adjusting trip points for the RCD comparator with a higher current slope according to at least one embodiment.
Figure 6B:
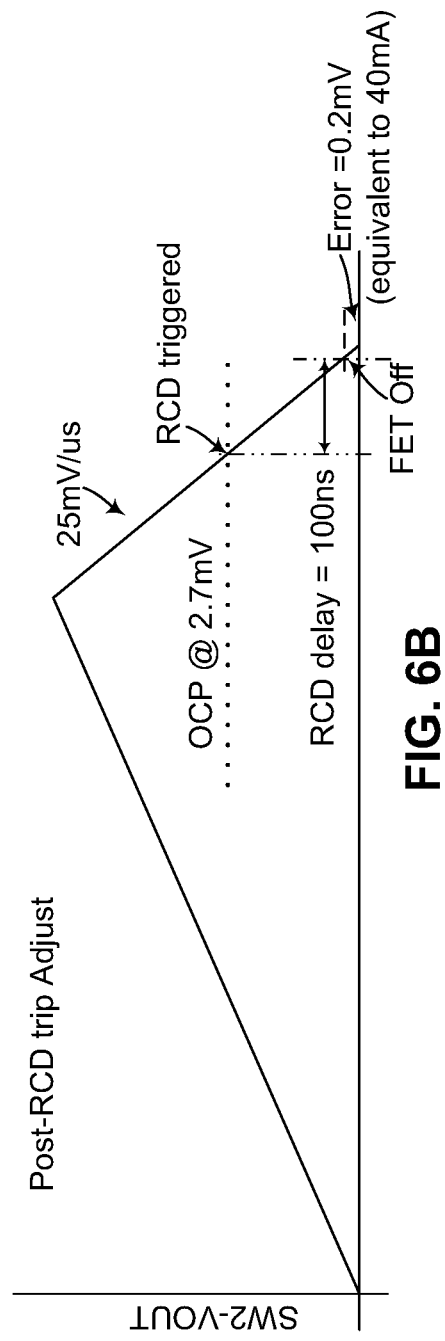
FIG. 6B is a graph that illustrates a logic-generated change to the trip points of FIG. 6A so that the first high-side switch is turned off close to the zero current crossing according to at least one embodiment.

In various embodiments, when the BB converter 100 operates in the PSM, the BB control logic 210 can sense Vin and Vout voltages, knows the inductance of the inductor 102 and mode information, from which information the BB control logic 210 can calculate the slope of the current through the inductor 102 and adjust ZCD and/or RCD trip points. Adjusting these trip points can enable turning off the first low-side switch 106 (or LS1) by the ZCD comparator 222 and turning off the second high-side switch 110 (or HS2) by the RCD comparator 224 very close to zero crossing of the inductor current in order to improve efficiency without the additional design complexity of hardware. FIGS. 6A-6B (higher current slope through inductor 102) and 7A-7B (lower current slope through inductor 102) illustrate some examples on actual inductor output current waveforms, with particular emphasis on operation of the RCD comparator 224.

FIG. 6A is a graph of an example inductor output waveform that illustrates the need for triggering and adjusting trip points for the RCD comparator 224 with a higher current slope according to at least one embodiment. With reference to the graph of FIG. 6A, for purposes of explanation only, assume Vin is 6 V, Vout is 21 V, the inductance (L) of the inductor 102 is 3 the slope of the inductor current (di/dt) is 15 A/3 μs, or 5 A/μs, the resistance of the second high-side switch 110 is 5 mΩ, the sensing threshold voltage of the RCD comparator 224 is 1.5 mV, and the sensing delay of the RCD comparator 224 is 100 ns. By default, an error would occur when the actual FET (e.g., the second high-side switch 110) gets turned off at −1 mV, which corresponds to 200 mA of reverse current.

FIG. 6B is a graph that illustrates a logic-generated change to the trip points of FIG. 6A so that the first high-side switch is turned off close to the zero current crossing according to at least one embodiment. As the BB control logic 210 has the information of Vin, Vout, and inductance, the BB control logic 210 can calculate slope and dynamically change the trip point of the RCD comparator 224 by +2 ticks (each tick of 0.6 mV) from 1.5 mV to 2.7 mV. With this trip-point change, the FET (of the second high-side switch 110) turns off very close to zero-crossing with a small error of 0.2 mV, which corresponds to 40 mA of current.

Figure 7A:
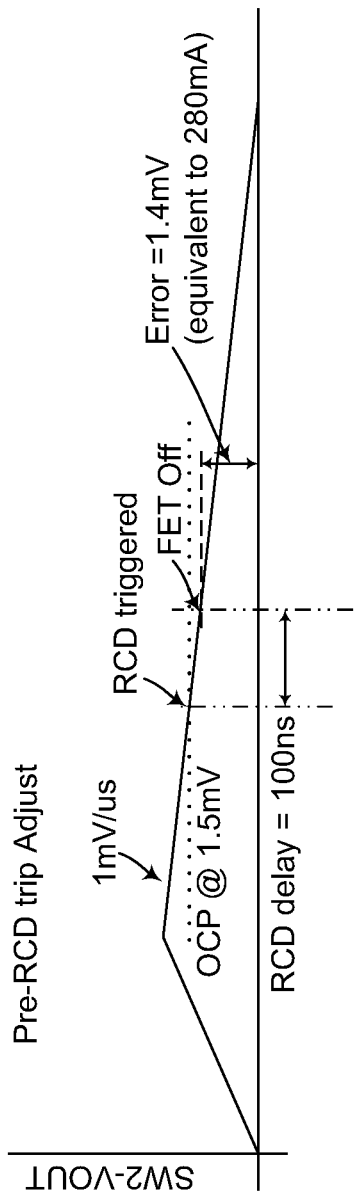
FIG. 7A is a graph of an example inductor output waveform that illustrates the need for triggering and adjusting trip points for the RCD comparator with a lower current slope according to at least one embodiment.

FIG. 7A is a graph of an example inductor output waveform that illustrates the need for triggering and adjusting trip points for the RCD comparator 224 with a lower current slope according to at least one embodiment. With reference to the graph of FIG. 7A, for purposes of explanation only, assume Vin is 6 V, Vout is 6.6 V, inductance (L) of the inductor 102 is 3 the slope of the inductor current (di/dt) is 0.6 A/3 μs, or 0.2 A/μs, the resistance of the second high-side switch 110 is 5 mΩ, the sensing threshold voltage of the RCD comparator 224 is 1.5 mV, and the sensing delay of the RCD comparator 224 is 100 ns. By default, an error would occur when the actual FET (e.g., the second high-side switch 110) gets turned off at 1.4 mV, which corresponds to 280 mA of current, significantly more current than the example of FIG. 6A.

Figure 7B:
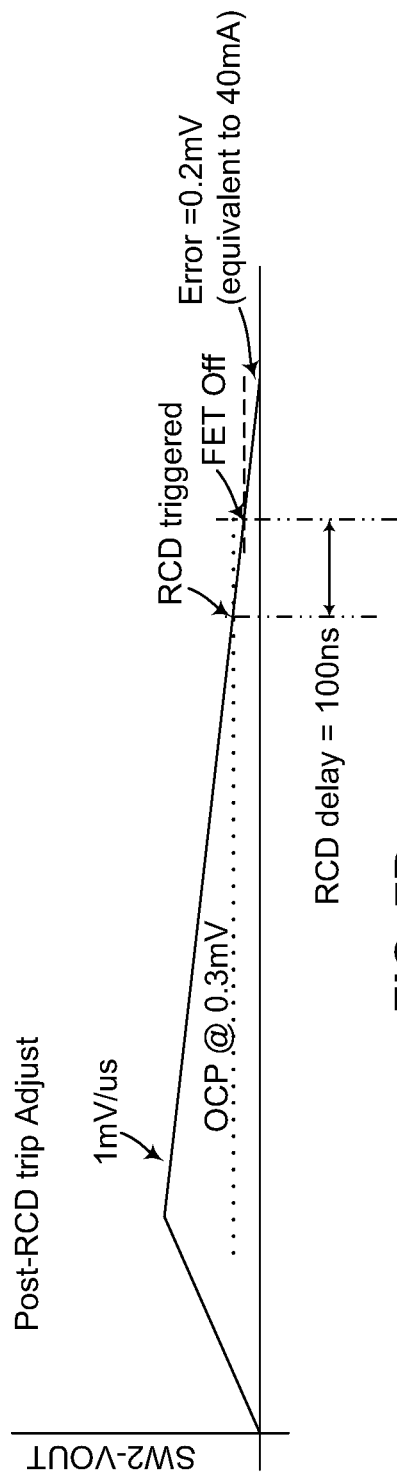
FIG. 7B is a graph that illustrates a logic-generated change to the trip points of FIG. 7A so that the first high-side switch is turned off close to the zero current crossing according to at least one embodiment.

FIG. 7B is a graph that illustrates a logic-generated change to the trip points of FIG. 7A so that the first high-side switch is turned off close to the zero current crossing according to at least one embodiment. As the BB control logic 210 has the information of Vin, Vout, and inductance, the BB control logic 210 can calculate slope and dynamically change the trip point of the RCD comparator 224 by −2 ticks (each tick of 0.6 mV) from 1.5 mV to 0.3 mV. With this trip-point change, FET (of the second high-side switch 110) turns off very close to zero-crossing with a small error of 0.2 mV, which corresponds to 40 mA of current. In at least some embodiments, the examples in the graphs of FIGS. 7A-7B are similarly applied to the ZCD comparator circuit 222 in order to bring the ZCD threshold very close to zero current and thereby improve efficiency.

In various embodiments, when the BB converter 100 operates in the FCCM, the BB control logic 210 can use the RCD comparator 224 on the second high-side switch 110 to avoid reverse current. With settable coarse trip points of the RCD comparator 224, the BB control logic 210 can use the RCD comparator 224 to detect and switch off reverse current at a desired threshold (e.g., −5 A, −7 A, or the like) without affecting normal operation. For a two-switch mode (e.g., buck only or boost only), the same die can be used without altering design as the trip-point adjustment scheme described herein can be independently enabled for the ZCD comparator 222 or the RCD comparator 224, e.g., via firmware configuration of the BB control logic 210. Thus, for example, in the buck-only mode, where the second high-side switch 110 is bypassed (and the second low-side switch 108 is not present), the BB control logic 210 can use the ZCD comparator 222 to detect and switch off reverse current at a desired threshold (e.g., −5 A, −7 A, or the like) without affecting normal operation. Further, in the boost-only mode, where the first high-side switch 104 is bypassed and the first low-side switch 106 is not present, the BB control logic 210 can use the RCD comparator 224 to detect and switch off reverse current at a desired threshold (e.g., −5 A, −7 A, or the like) without affecting normal operation. A customer can set the firmware to one of these two modes based on the application, and the firmware can then program the hardware of the BB controller 210 accordingly. Switching modes at a later time is also enabled by way of performing a firmware update, for example.

Figure 8:
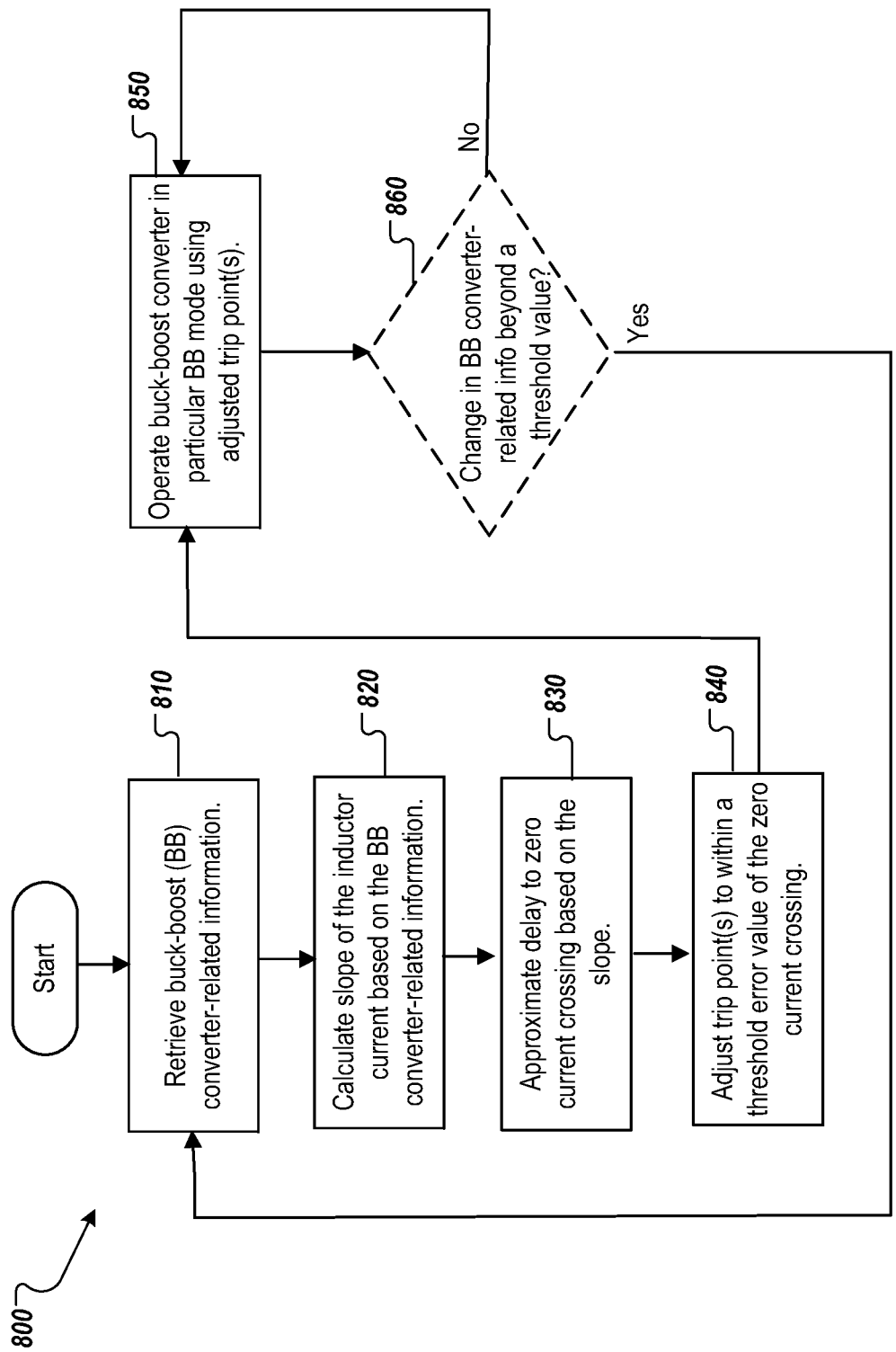
FIG. 8 is a flow diagram of a method of adjusting trip points of buck-boost comparator circuits according to at least some of the disclosed embodiments.

FIG. 8 is a flow diagram of a method 800 of adjusting trip points of buck-boost comparator circuits according to at least some of the disclosed embodiments. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the BB control logic 210 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing logic retrieves buck-boost converter-related (or buck-only converter-related information or boost-only converter-related information). For example, the processing logic can sense Vin and/or Vout voltages, retrieve (e.g., as configuration information stored in read-only memory, flash memory, etc.) the inductance of the inductor 102, mode information related to the current mode of operation, as well as other information as discussed with reference to FIGS. 6A-6B and 7A-7B.

At operation 820, the processing logic calculates a slope of the inductor current based on the buck-boost (or buck-only or boost-only) converter-related information.

At operation 830, the processing logic approximates a delay to zero current crossing of the inductor current based on the calculated slope.

At operation 840, the processing logic adjusts one or more trip points of one or more BB converter comparator (e.g., the ZCD comparator 222 or the RCD comparator 224) to within a threshold error value of the zero current crossing. While the threshold error value in FIGS. 6A-6B and 7A-7B is 0.2 mV, different low error values are envisioned (e.g., 0.1 mV, 0.3 mV, 0.4 mV).

At operation 850, the processing logic operates the buck-boost converter 100 in a particular BB mode using the one or more adjusted trip points.

At operation 860, the processing logic optionally determines whether a change in retrieved buck-boost converter-related (or buck-only or boost-only) information is detected, e.g., beyond a threshold value to be considered "detected." This detected change, for example, can include but not be limited to, a change in Vin beyond a programmable pre-defined threshold, a change in Vout beyond a programmable pre-defined threshold or change in mode-of-operation, a change in ambient temperature beyond a programmable pre-defined threshold or a change in die-temperature beyond a programmable pre-defined threshold. These changes in buck-boost related information values calls for a need to further calibrate the BB converter comparators. Thus, if the change in informational values are not detected at operation 860, then the method 800 loops back to operation 850 and continues to operate with the previously adjusted trip point(s). Otherwise, if the change in informational values is detected at operation 860, the processing logic can loop back to the beginning of the method 800, e.g., at operation 810, to determine newly adjusted trip points for use during continued operation of the BB converter 100.

Various embodiments of the high-voltage tolerant, high-speed reverse current detection and protection for buck-boost converters for USB-C controllers described herein may include various operations. These operations may be performed and/or controlled by hardware components, digital hardware and/or firmware, and/or combinations thereof. As used herein, the term "coupled to" may mean connected directly to or connected indirectly through one or more intervening components. Any of the signals provided over various on-die buses may be time multiplexed with other signals and provided over one or more common on-die buses. Additionally, the interconnection between circuit components or blocks may be shown as buses or as single signal lines. Each of the buses may alternatively be one or more single signal lines and each of the single signal lines may alternatively be buses.

Certain embodiments may be implemented by firmware instructions stored on a non-transitory computer-readable medium, e.g., such as volatile memory and/or non-volatile memory. These instructions may be used to program and/or configure one or more devices that include processors (e.g., CPUs) or equivalents thereof (e.g., such as processing cores, processing engines, microcontrollers, and the like), so that when executed by the processor(s) or the equivalents thereof, the instructions cause the device(s) to perform the described operations for USB-C mode-transition architecture described herein. The non-transitory computer-readable storage medium may include, but is not limited to, electromagnetic storage medium, read-only memory (ROM), random-access memory (RAM), erasable programmable memory (e.g., EPROM and EEPROM), flash memory, or another now-known or later-developed non-transitory type of medium that is suitable for storing information.

Although the operations of the circuit(s) and block(s) herein are shown and described in a particular order, in some embodiments the order of the operations of each circuit/block may be altered so that certain operations may be performed in an inverse order or so that certain operation may be performed, at least in part, concurrently and/or in parallel with other operations. In other embodiments, instructions or sub-operations of distinct operations may be performed in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A zero crossing detection comparator circuit comprising:
   a negative input coupled to a ground of a buck-boost converter;
   a positive input coupled to an input of an inductor of the buck-boost converter;
   an output coupled to a gate of a first low-side switch of the buck-boost converter, wherein a value at the output is to be asserted in response to detecting a zero current flow through the first low-side switch while the buck-boost converter operates in buck mode;
a first resistor coupled to the negative input;
a second resistor coupled to the positive input, the first resistor having a substantially identical resistance as the second resistor;
a first drain-extended n-type transistor (DENFET) coupled to the first resistor;
a second DENFET coupled to the second resistor, wherein gates of the first and second DENFETs are coupled to a supply voltage;
an operational amplifier comprising:
  a second positive input coupled to ground through a third resistor;
  a second negative input coupled to a bandgap voltage reference; and
  a second output; and
a multi-stage amplifier coupled between the second output of the operational amplifier, the first and second DENFETs, and the output.

2. The zero crossing detection comparator circuit of claim 1, wherein the first resistor and the second resistor are variable resistors, which are adjustable to set a detection threshold current.

3. The zero crossing detection comparator circuit of claim 1, further comprising:
a p-type metal-oxide-semiconductor (PMOS) transistor having a gate coupled to the second output, a source coupled to the supply voltage, and a drain coupled to a first stage of the multi-stage amplifier;
the third resistor; and
a second PMOS transistor comprising:
  a source coupled to the supply voltage;
  a drain coupled to the third resistor; and
  a gate coupled to the second output.

4. The zero crossing detection comparator circuit of claim 1, further comprising:
a third DENFET coupled to the negative input;
a fourth DENFET coupled to the positive input; and
a current mirror multiplier coupled between the second output and the third and fourth DENFETs, the current mirror multiplier comprising a bank of PMOS transistors that are selectable to adjust a reference current at the second output of the operational amplifier.

5. The zero crossing detection comparator circuit of claim 4, wherein the current mirror multiplier comprises at least:
a first PMOS transistor comprising a source coupled to the supply voltage, a drain coupled to the third DENFET, and a gate coupled to the second output; and
a second PMOS transistor comprising a source coupled to the supply voltage, a drain coupled to the fourth DENFET, and a gate coupled to the second output.

6. The zero crossing detection comparator circuit of claim 1, wherein the multi-stage amplifier comprises:
a first stage amplifier coupled to the second output;
a second stage amplifier coupled to the first stage amplifier; and
an output stage coupled between the second stage amplifier and the output.

7. The zero crossing detection comparator circuit of claim 6, wherein the first stage amplifier comprises:
a first path coupled to the first DENFET and comprising, in series, a fourth resistor and a first n-type metal-oxide-semiconductor (NMOS) transistor, wherein a gate of the first NMOS transistor is coupled to a drain of the first NMOS transistor; and
a second path coupled to the second DENFET and comprising, in series, a fifth resistor and a second NMOS transistor, the fourth resistor and the fifth resistor having substantially identical resistances, and wherein gates of the first and second NMOS transistors are connected.

8. The zero crossing detection comparator circuit of claim 7, wherein the second stage amplifier comprises:
a third path comprising, in series, a first PMOS transistor and a third NMOS transistor, wherein the first PMOS transistor comprises a source coupled to a supply voltage, a drain coupled to a drain of the third NMOS transistor, and a gate coupled to the drain, and wherein the third NMOS transistor comprises a source coupled to the second DENFET and a gate coupled to gates of the first and second NMOS transistors;
a fourth path comprising, in series, a second PMOS transistor and a fourth NMOS transistor, wherein the second PMOS transistor comprises a source coupled to the supply voltage, a drain coupled to a drain of the fourth NMOS transistor, and a gate coupled to the gate of the first PMOS transistor, and wherein the fourth NMOS transistor comprises a source coupled to the first DENFET and a gate coupled to the drain of the second NMOS transistor; and
a fifth NMOS transistor comprising a drain coupled to the supply voltage, a source coupled to drains of the second PMOS transistor and the fourth NMOS transistor, and a gate coupled to the drain of the first PMOS transistor.

9. The zero crossing detection comparator circuit of claim 8, wherein the output stage comprises:
a third PMOS transistor coupled in series with a sixth NMOS transistor;
the third PMOS transistor comprising a source coupled to a supply voltage, a drain coupled to a drain of the sixth NMOS transistor and to an output buffer, which is in turn coupled to the output; and
the sixth NMOS transistor comprising a source coupled to a current source, which is coupled to the ground, wherein gates of the third PMOS transistor and the sixth NMOS transistor are coupled to the second stage amplifier.

10. A reverse current detection comparator circuit comprising:
a negative input coupled to an output of an inductor of a buck-boost converter;
a positive input coupled to a voltage bus (Vbus) output of the buck-boost converter;
an output coupled to a gate of a second high-side switch of the buck-boost converter, wherein a value at the output is to be asserted in response to detecting a zero current flow through the second high-side switch while the buck-boost converter operates in boost mode;
a first resistor coupled to the negative input;
a second resistor coupled to the positive input, the first resistor having a substantially identical resistance as the second resistor;
a first drain-extended p-type transistor (DEPFET) coupled to the first resistor;
a second DEPFET coupled to the second resistor, wherein gates of the first and second DEPFETs are coupled together;

an operational amplifier comprising:
a second positive input coupled to a ground through a third resistor;
a second negative input coupled to a bandgap voltage reference; and
a second output; and
a multi-stage amplifier coupled between the second output of the operational amplifier, the first and second DEPFETs, and the output.

11. The reverse current detection comparator circuit of claim 10, wherein the first resistor and the second resistor are variable resistors, which are adjustable to set a detection threshold current.

12. The reverse current detection comparator circuit of claim 10, further comprising:
a p-type metal-oxide-semiconductor (PMOS) transistor having a gate coupled to the second output, a source coupled to a supply voltage, and a drain coupled to a current mirror;
the third resistor; and
a second PMOS transistor comprising:
a source coupled to the supply voltage;
a drain coupled to the third resistor; and
a gate coupled to the second output.

13. The reverse current detection comparator circuit of claim 10, further comprising:
a set of drain-extended n-type transistors (DENFETs) each comprising a gate coupled to a supply voltage, the set of DENFETs comprising:
a first DENFET comprising a drain coupled to the positive input;
a second DENFET comprising a drain coupled to the first resistor;
a third DENFET comprising a drain coupled to the second resistor; and
a fourth DENFET comprising a drain coupled to a first stage amplifier of the multi-stage amplifier; and
a set of n-type metal-oxide-semiconductor (NMOS) transistors comprising gates coupled together and each comprising a source coupled to ground, the set of NMOS transistors comprising:
a first NMOS transistor comprising a drain coupled to a drain of a PMOS transistor and to a gate of the first NMOS transistor, the PMOS transistor having a source coupled to the supply voltage and a gate coupled to the second output;
a second NMOS transistor comprising a drain coupled to a source of the first DENFET and a gate coupled to the gate of the first NMOS transistor;
a third NMOS transistor comprising a drain coupled to a source of the second DENFET;
a fourth NMOS transistor comprising a drain coupled to a source of the third DENFET; and
a fifth NMOS transistor comprising a drain coupled to a source of the fourth DENFET.

14. The reverse current detection comparator circuit of claim 13, wherein the third and fourth NMOS transistors are a current mirror multiplier that further comprise a bank of NMOS transistors that are selectable to adjust a reference current at the second output of the operational amplifier.

15. The reverse current detection comparator circuit of claim 10, wherein a first stage amplifier, of the multi-stage amplifier, comprises:
a first path coupled to the first DEPFET and comprising, in series, a first high-voltage p-type field-effect transistor (PFET) and a fourth resistor; and
a second path coupled to the second DEPFET and comprising, in series, a second high-voltage PFET and a fifth resistor, wherein a drain of the second high-voltage PFET is coupled to a gate of the second high-voltage PFET, the fourth resistor and the fifth resistor comprise substantially identical resistances, and gates of the first and second high-voltage PFETs are connected.

16. The reverse current detection comparator circuit of claim 15, wherein a second stage amplifier of the multi-stage amplifier comprises:
a third high-voltage PFET comprising a source coupled to the first DEPFET and a gate coupled to gates of the first and second high-voltage PFETs;
a fourth high-voltage PFET comprising a source coupled to the second DEPFET and a gate coupled to a drain of the first high-voltage PFET;
a third DEPFET coupled to the third high-voltage PFET;
a fourth DEPFET coupled to the fourth high-voltage PFET, wherein gates of the third and fourth DEPFET are couple together;
a first PMOS transistor comprising a source coupled to the third DEPFET;
a second PMOS transistor comprising a source coupled to the fourth DEPFET, wherein gates of the first and second PMOS transistors are coupled to a supply voltage, and drains of the first and second PMOS transistors are coupled to the ground; and
a third PMOS transistor comprising a source coupled to the source of the second PMOS transistor, a drain coupled to the ground, and a gate coupled to the source of the first PMOS transistor.

17. The reverse current detection comparator circuit of claim 16, wherein an output stage of the multi-stage amplifier comprises:
a first n-type metal-oxide-semiconductor (NMOS) transistor comprising a drain coupled to the gate of the third PMOS transistor, a gate coupled to the source of the first NMOS transistor, and a source coupled to the ground;
a second NMOS transistor comprising a drain coupled to a source of the third PMOS transistor, a gate coupled to the gate of the first NMOS transistor, and a source coupled to the ground;
a third NMOS transistor comprising a drain coupled to the supply voltage through a constant current bias, a gate coupled to the drain of the second NMOS transistor, and a source coupled to the ground; and
an output inverted buffer coupled between the drain of the third NMOS transistor and the output.

* * * * *